United States Patent [19]
Aranovsky

[11] Patent Number: 5,331,478
[45] Date of Patent: Jul. 19, 1994

[54] MAGNETORESISTIVE HEAD AMPLIFIER

[75] Inventor: Anatoly Aranovsky, Tustin, Calif.

[73] Assignee: Silicon Systems, Inc., Tustin, Calif.

[21] Appl. No.: 958,037

[22] Filed: Oct. 7, 1992

[51] Int. Cl.$^5$ .............................................. G11B 5/02
[52] U.S. Cl. ..................................... 360/67; 307/309;
330/252
[58] Field of Search ............... 330/6.62, 252; 307/309;
360/67, 113; 365/8, 158, 209

[56] References Cited

U.S. PATENT DOCUMENTS 4,706,138  11/1987  Jove et al. ....................... 360/113 X
4,833,559   5/1989  Belk .................................. 360/113

*Primary Examiner*—James B. Mullins
*Attorney, Agent, or Firm*—Hecker & Harriman

[57] ABSTRACT

An amplifier for biasing and amplifying the signals produced by a magnetoresistive element is provided. The input stage of this circuit includes two transistors in a differential common base configuration having a low input impedance. Since the two transistors are coupled to separate identical current sources, balance between the currents through the two transistors is maintained. The currents are balanced without the use of a feedback loop. Additional input stages may be added to allow signals from additional magnetoresistive elements to be selected and amplified. By using a common mode switching configuration, switching transients are greatly reduced.

15 Claims, 3 Drawing Sheets

MAGNETORESISTIVE HEAD AMPLIFIER

BACKGROUND OF THE INVENTION

1. Field of the Invention

The present invention is related to the field of amplifiers for magnetoresistance sensors.

2. Background Art

Preamplification circuitry is used to bias magnetoresistance (MR) sensors and to detect output signals generated by MR sensors. MR sensors are used as transducers for reading magnetically recorded data from disks having high-magnetization film media. MR sensors differ from inductive sensors in that they sense flux rather than change in flux per unit time. Since high density disk applications require closely spaced tracks of data, they exhibit lower signal flux than do lower density media. Despite the lower signal flux, MR sensors typically generate larger read signals than inductive heads in high density applications. Therefore, MR sensors provide improved read performance over inductive heads in high density recording applications.

An MR read sensor consists of a narrow stripe of material such as Ni-Fe which is mounted perpendicularly to disk media. The MR sensor has dimensions of height h and width w where the resistance of the sensor is inversely proportional to height h. The magnetoresistive effect causes the resistance of the sensor to vary according to magnetic flux from the media incident upon it.

Amplification circuitry provides a sense current to bias an MR sensor and amplifies read signals produced by the sensor. The sense current for an MR sensor can be supplied by means of constant voltage or constant current. Similarly, the electronic sensing of a resistance signal can take two essentially different forms: detecting the voltage across the sensor by means of a high input impedance voltage amplifier or detecting the current through the sensor by means of a current amplifier with a virtually shorted input.

Preamplification circuitry provides a sense current which is applied to an MR sensor to bias its response to produce an optimum rate of change in resistance with respect to a magnetic field. Therefore, data stored as magnetized locations on a disk causes the resistance of an MR sensor to vary as the data passes under the MR read mechanism. Preamplification circuitry detects changes in the voltage across the MR sensor due to changes in its resistance and amplifies this read signal generated by the sensor. Thus, an MR sensor properly biased by amplification circuitry provides a linear response to the instantaneous magnetic field of disk media passing by the sensor.

Because the resistance of MR sensors is inversely proportional to height h, it is desirable to bias the sensor so that it is insensitive to variations in the height of stripes due to manufacturing processes or due to wear. Thus, problems associated with differences in the height of MR sensors may be reduced. In particular, it is desirable to generate a sensor signal having a voltage which is proportional to the change in sensor resistance normalized by its resistance, $\Delta R_h/R_h$, where $\Delta R_h$ is the change in MR sensor resistance, $R_h$, from its steady-state resistance when a magnetic field is incident upon the MR sensor. It is noted that the steady state value of $R_h$ refers to the resistance value of $R_h$ while biased, but not being subjected to a magnetic field.

Figure 1:
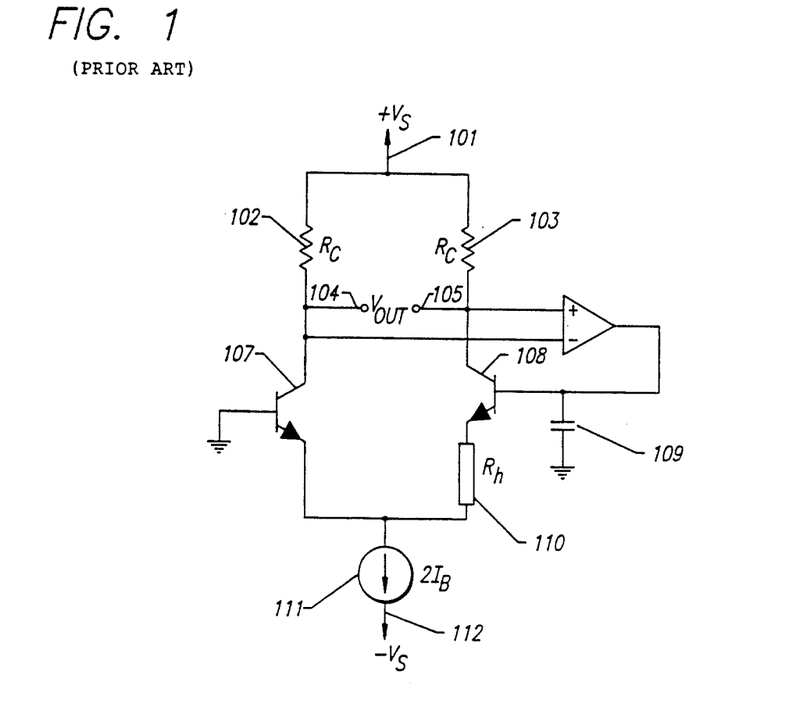
FIG. 1 is a schematic diagram illustrating a prior art MR head amplifier circuit.

A diagram illustrating a prior art pre-amplifier is illustrated in FIG. 1. The circuit includes NPN transistors 107 and 108, amplifier 106, MR sensor 110, capacitor 109 and current source 111. Voltage rail 101 at a voltage of $+V_S$ is coupled to the first terminal of resistor 102 and the first terminal of resistor 103. Both resistors 102 and 103 have a value of $R_C$. The second terminal of resistor 102 is coupled to output terminal 104, the inverting input of transconductance amplifier 106 and the collector of NPN transistor 107. The second terminal of resistor 103 is coupled to output terminal 105, the non-inverting input of transconductance amplifier 106 and the collector of NPN transistor 108. The output of amplifier 106 is coupled to the first terminal of capacitor 109 and the base of transistor 108. The second terminal of capacitor 109 is coupled to ground.

The base of transistor 107 is coupled to ground. The emitter of transistor 107 is coupled to the first terminal of current source 111. The emitter of transistor 108 is coupled to the first terminal of MR sensor 110. The resistance of MR sensor 110 has a value of $R_h$. The second terminal of MR sensor 110 is coupled to the first terminal of current source 111. A current of $2I_B$ flows from the first terminal to the second terminal of current source 111. The second terminal of current source 111 is coupled to voltage rail 112. Voltage rail 112 has a voltage of $-V_S$. The differential output signal seen at output terminals 104 and 105 is $V_{OUT}$.

FIG. 1 illustrates a prior art circuit that biases MR sensor 110 having resistance $R_h$ and amplifies the signal generated by the MR sensor 110. Current source 111 sinks emitter currents from transistor 107 and 108 equal to a constant value $2I_B$. MR sensor 110 causes a current imbalance in the two current paths through the differential pair resulting in a voltage across output terminals 105 and 104. The output signal $V_{out}$ produced by the differential pair is fed back through amplifier 106 and capacitor 109 to the base of transistor 108 to correct for DC offsets due to the steady-state resistance value of MR sensor 110 and variations in transistors 107 and 108. This feedback produces balanced current flow through each path of the differential amplifier. The low frequency response of this configuration is modified by adjusting the gain of amplifier 106 and capacitor 109 of the feedback loop in order to set the dominant pole appropriately.

A disadvantage of the prior art circuit is the considerable recovery time required to stabilize such a circuit as shown in FIG. 1 when switching from one sensor to another. This is accomplished by deactivating one sensor and associated input stage and activating another. The prior art describes a circuit for moving the dominant low frequency pole during switchover. However, the recovery time is still considerable due to the fact that the feedback loop control signal is applied to the input stage differentially. Thus, the transient at the output of the differential stage must decay sufficiently to resolve low level read signals, and this process requires substantial time. Another disadvantage is that the prior art amplifier requires additional, non-linear circuitry, which increases the complexity of the amplifier.

SUMMARY OF THE INVENTION

A preamplification circuit for biasing an MR sensor and amplifying a signal generated by the MR sensor is disclosed. This preamplifier provides improved recovery time when switching input stages between MR read heads and has a simpler, more efficient design.

The present invention avoids the disadvantages of the prior art solutions by providing separate balanced current sources for each side of a differential pair. Thus, the present invention eliminates the need for an error amplifier to adjust the bias of one transistor of the differential pair to maintain balance. By allowing both transistors of the differential pair to be biased by the same voltage source, the present invention allows both transistors of the differential pair to be switched simultaneously, such as when selecting an MR head, and eliminates switching transients that occur when selecting heads with the prior art circuit.

In the preferred embodiment, a preamplification circuit biases MR sensors to produce a maximum, linear response to the magnetic fields of data stored on disk media characterized by lower signal strength due to increased track density. Such biasing by preamplification circuitry produces a maximum change in sensor resistance with respect to magnetic field. In order to compensate for variation in the stripe height of sensors, the preamplifier removes the variable DC offset of each sensor at its output terminals through balanced current flow through each path of the preamplification circuit. For DC signal levels, balanced current flow is produced by biasing the transistors of the preamplifier with the same voltage source and by using separate current sources to draw equal emitter currents from the transistors thereby removing the variable offset in the preamplifier output voltage. By ensuring that the emitter currents are equal in the steady state, compensation is automatically provided for long term variations in the MR head steady state resistance.

For AC signals, a capacitor couples a first node between the emitter of a first transistor and a first current source to a second node between the MR sensor and a second current source. The MR sensor appears as a degenerately coupled resistance in a differential pair for AC signals.

The same bias voltage source may be used for all differential pair amplifier transistors, thereby eliminating potential for switching transients that is present when the transistors are coupled to separate bias voltage sources. Further, this open loop method allows collector current for the two halves of the differential pair to be set independently from one another to keep the currents in balance and eliminates the need for a error amplifier to correct current imbalances. Thus, a simplified method of biasing an MR sensor and producing read signals results and the disadvantages of the prior art have been overcome.

DETAILED DESCRIPTION OF THE INVENTION

An amplification circuit for biasing MR sensors and detecting read signals generated by MR sensors is described. In the following description, numerous specific details, such as number and nature of external transistors, capacitances, types of semiconductors, etc., are described in detail in order to provide a more thorough description of the present invention. It will be apparent, however, to one skilled in the art, that the present invention may be practiced without these specific details. In other instances, well-known features have not been described in detail so as not to unnecessarily obscure the present invention.

Although the invention is described as being embodied in an implementation using bipolar technology, it is understood that the invention may also be practiced using other technologies, including, but not limited to, complementary metal-oxide semiconductor (CMOS) technology.

Although semiconductor amplification and switching devices, such as bipolar transistors and FET's, are described, the present invention may be practiced with any type of amplification and switching devices.

To read signals from magnetic media requires a magnetic sensor. Although inductive magnetic sensors have been used in the past, MR sensors are becoming increasingly popular because of their ability to better read information from high-density media. However, MR sensors require bias current to operate properly. MR sensors also require amplification circuitry to amplify the signals produced. The amplification circuitry must be relatively immune to noise and interference from variations in the steady state resistance of the MR sensor, from variations among components, and from switching between multiple MR sensors. Therefore, an MR head amplifier that meets these requirements is needed.

The present invention avoids the disadvantages of the prior art. The present invention includes a pair of transistors configured to function as a common base differential amplifier input stage at AC frequencies. At DC, the transistors are isolated, allowing the DC current through the transistors to be controlled independently. Separate balanced current sources provide equal currents through the two transistors. The current through one of the transistors also flows through the MR sensor. Thus, the bias current requirement of the MR sensor is provided by the present invention. Because the current is controlled by the separate balanced current sources, the same bias voltage source may be used for each of the two transistors. Thus, any fluctuations in the bias voltage result only in a common mode voltage, to which the differential amplifier configuration exhibits a high degree of immunity.

The present invention also allows the use of multiple MR sensors and input stages. Because the same bias voltage source may be used for each of the two transistors of the differential pair, the bias voltage may be used to select or deselect the MR sensor associated with that input stage. The use of a common mode signal to select and deselect the MR sensors reduces the likelihood of switching transients. If the system includes many MR sensors, the capacitance associated with the lines by which they are coupled may be significant. Combined with the resistances present, these capacitances can lead to reduced bandwidth. To counter this problem, a common base stage may be added to the input stage to form a cascode configuration. The cascode configuration provides improved bandwidth.

Figure 2:
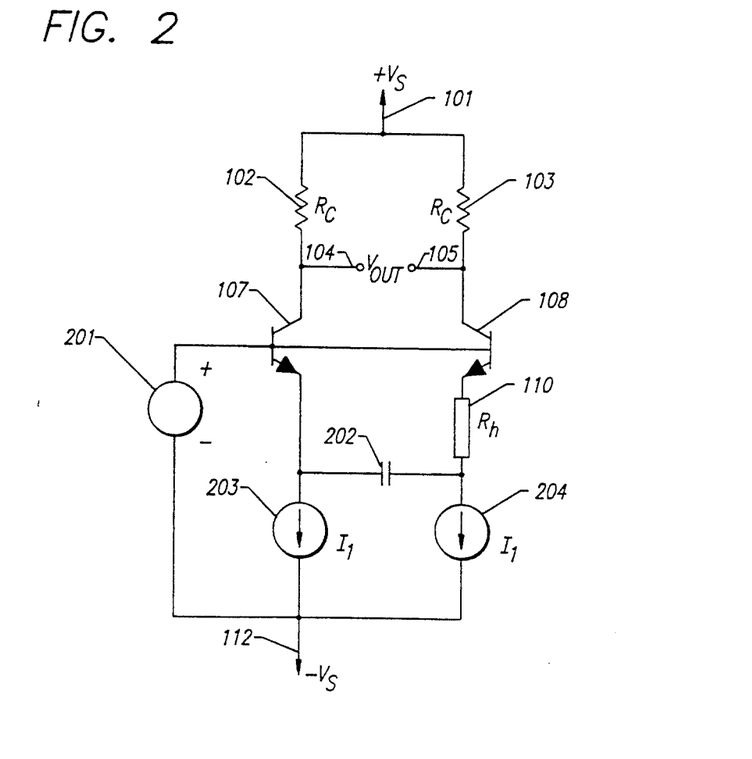
FIG. 2 is a schematic diagram illustrating a MR head amplifier circuit based on the present invention.

The preferred embodiment of the present invention is illustrated in FIG. 2. In FIG. 2, voltage rail 101 with a potential of $+V_S$ is coupled to the first terminal of resistor 102 and the first terminal of resistor 103. The second terminal of resistor 102 is coupled to output terminal 104 and the collector of transistor 107. The second terminal of resistor 103 is coupled to the output terminal 105 and the collector of transistor 108. The bases of transistor 107 and 108 are coupled to the positive terminal of voltage source 201. The negative terminal of voltage source 201 is coupled to voltage rail 112.

The emitter terminal of transistor 107 is coupled to the first terminal of capacitor 202 and the first terminal of current source 203. The emitter terminal of transistor 108 is coupled to the first terminal of MR element 110. The second terminal of MR element 110 is coupled to the second terminal of capacitor 202 and the first terminal of current source 204. Both current sources 203 and 204 have a current of $I_1$ flowing from their first terminal to their second terminal. The second terminal of current source 203 is coupled to voltage rail 112. The second terminal of current source 204 is coupled to the voltage rail 112. Voltage rail 112 has a potential of $-V_S$.

In FIG. 2, at AC frequencies, capacitor 202 couples the first terminal of current source 203 to the first terminal of current source 204. Thus, at AC frequencies, transistors 107 and 108 form a common base differential amplifier. However, capacitor 202 blocks DC and allows the DC flow through current sources 203 and 204 to be controlled independently by those current sources, respectively. Current sources 203 and 204 maintain constant equal currents through transistors 107 and 108 of the differential pair. The current through transistor 108 also flows through MR element 110. Thus, MR element 110 is biased with a constant DC flow.

Since current sources 203 and 204 maintain balanced current through transistors 107 and 108, the signals applied to the bases of transistors 107 and 108 need not be controlled separately. Thus, a single voltage source 201 may be coupled to the bases of both transistors 107 and 108. Use of a single voltage to bias both transistors 107 and 108 is advantageous since the voltage is a common mode voltage and variations of the bias voltage do not affect the output as they would with a differential mode bias scheme.

Collector resistors 102 and 103 are coupled to voltage source 101. Thus, if known amounts of current are flowing through resistors 102 and 103, the voltage drops across the resistors 102 and 103 can be readily determined. Also, the voltages at outputs 104 and 105 can be determined. When MR element 110 is subjected to a magnetic field, the MR element 110 will have a component of resistance, $\Delta R_h$, that varies as the square of the cosine of the angle between the magnetization and the current. The resistance change with applied fields is about 2% or less of the steady state resistance $R_h$, in typical MR materials.

As the MR element is subjected to magnetic fields of varying orientation, the DC bias current of the MR element will be modulated by an AC component representative of the changing magnetic fields. Since any AC fluctuation of the current through MR element 110 will also change the current through resistor 103, the voltage at output 105. Because of the differential amplifier configuration, the voltage at output 104 will also be changed to produce a differential output signal across outputs 104 and 105. Thus, the circuit of FIG. 2 provides biasing of MR element 110 and amplifies the changing magnetic field to which MR element 110 is being subjected to produce a differential output across outputs 104 and 105. Since transistors 107 and 108 have inherently low input impedance at their emitters, the circuit of FIG. 2 provides a transimpedance amplifier which amplifies the change in current through MR element 110 to produce a change in voltage across outputs 104 and 105. Thus, $\Delta R_h/R_h$ is found by sensing the current through MR element 110.

The voltage across outputs 104 and 105 follows the equations below:

$$V_{OUT} \propto \frac{\Delta R_h I_{R_h}}{R_{in} + R_h}$$

Thus, $$V_{OUT} \propto \frac{\Delta R_h}{R_h} I_{R_h} \text{ as } R_{in} \to 0$$

where $V_{OUT}$ is the voltage difference between outputs 104 and 105, $I_{R_h}$ is the bias current through MR element 110, $R_{in}$ is the input impedance of the input stage that includes transistors 107 and 108 as seen from MR element 110, $R_h$ is the resistance of MR element 110 and $\Delta R_h$ is the change in the resistance of MR element 110 when a magnetic field incident upon it.

The extent to which the differential output voltage is affected by variations in the steady state resistance value of the MR element depends on the value of input impedance of the input stage.

If the input impedance of the input stage is low, the differential output voltage is less sensitive to variations in the steady state resistance value of the MR element.

Thus, if $R_{in}$ is low and $I_{R_h}$ is constant, the output voltage $V_{OUT}$ is proportional to $\Delta R_h/R_h$.

Thus, the circuit of FIG. 2 provides an output based on $\Delta R_h/R_h$ when MR element 110 is subjected to varying magnetic fields such as those encountered by a read head reading rotating magnetic media.

Figure 3:
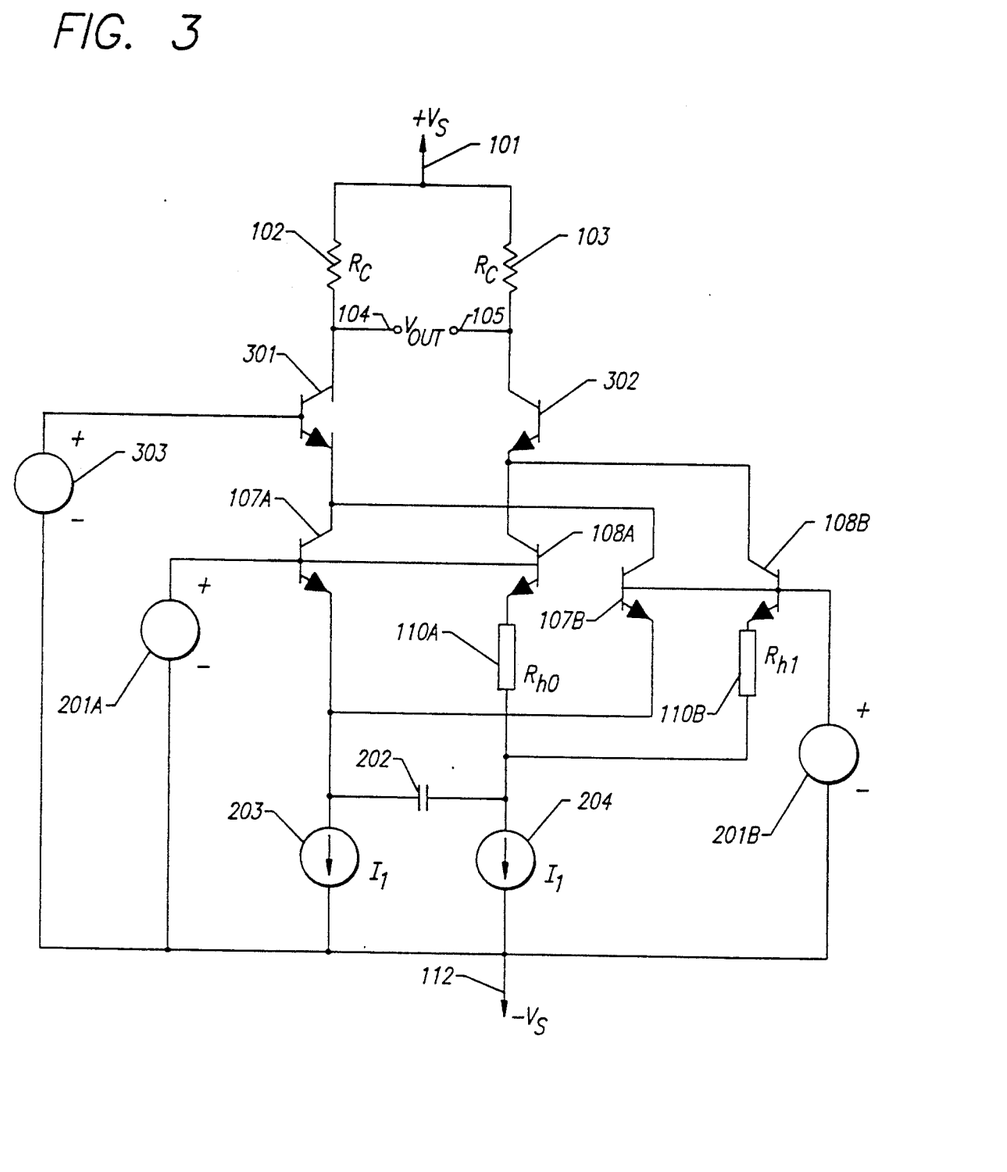
FIG. 3 is a schematic diagram illustrating a MR head amplifier circuit based on the present invention for amplifying signals from two MR heads.

An alternate embodiment of the present invention is illustrated in FIG. 3. In the alternate embodiment of FIG. 3, voltage rail 101 with a potential of $+V_S$ is coupled to the first terminal of resistor 102 and the first terminal of resistor 103. The second terminal of resistor 102 is coupled to the collector of transistor 301 and output terminal 104. The second terminal of resistor 103 is coupled to output terminal 105 and the collector terminal of transistor 302. The bases of transistors 301 and 302 are coupled to the positive terminal of voltage source 303. The negative terminal of voltage source 303 is coupled to voltage rail 112, which has a potential of $-V_S$.

The emitter terminal of transistor 301 is coupled to the collector terminal of transistors 107A and 107B. The emitter terminal of transistor 302 is coupled to the collector terminal of transistors 108A and 108B. The bases of transistors 107A and 108A are coupled to the positive terminal of voltage source 201A. The negative terminal of voltage source 201A is coupled to voltage rail 112. The bases of transistors 107B and 108B are coupled to the positive terminal of voltage source 201B. The negative terminal of voltage source 201B is coupled to voltage rail 112.

The emitter of transistor 107A is coupled to the emitter terminal of transistor 107B, the first terminal of capacitor 202 and the first terminal of current source 203. The emitter terminal of transistor 108A is coupled to the first terminal of MR element 110A. The emitter terminal of transistor 108B is coupled to the first terminal of MR element 110B. The second terminal of MR element 110A is coupled to the second terminal of MR element 110B, the second terminal of capacitor 202 and the first terminal of current source 204. The second terminal of current source 203 is coupled to voltage rail 112. The second terminal of current source 204 is coupled to voltage rail 112. MR element 110A has a value of $R_{h0}$. MR element 110B has a value of $R_{h1}$. Current sources 203 and 204 have a value of $I_1$.

The circuit of FIG. 3 allows the use of multiple MR elements. Although the present invention may be practiced with any number of MR elements, the circuit of FIG. 3 is shown with only two MR elements, 110A and 110B. Each MR element has an input stage comprising two transistors associated with it. MR element 110A is associated with the input stage which includes transistors 107A and 108A. MR element 110B is associated with the input stage which includes transistors 107B and 108B. Transistors 107A and 108A are biased by voltage source 201A. Transistors 107B and 108B are biased by voltage source 201B.

By applying a bias voltage from voltage source 201A to transistors 107A and 108A, but setting voltage source 201B to a voltage inadequate to bias transistors 107B and 108B (for example, zero volts), MR element 110A can be selected and MR element 110B can be deselected. By applying a bias voltage from voltage source 201B to transistors 107B and 108B, but setting voltage source 201A to a voltage inadequate to bias transistors 107A and 108A (for example, zero volts), MR element 110B can be selected and MR element 110A can be deselected.

To change which MR element is selected, the voltages at voltage sources 201A and 201B may be changed instantaneously. Alternatively, the rate at which the voltages change may be controlled to further ensure the reduction of switching transients. For example, if MR element 110A is selected and it is desired to deselect MR element 110A and instead select MR element 110B, the voltage of voltage source 201A may be linearly decreased from its full bias voltage to zero over a fixed period of time while the voltage of voltage source 201B is being linearly increased from zero to its full bias voltage over the same period of time. By avoiding an instantaneous change of voltage, any switching transients can be eliminated.

Assuming MR element 110A is selected and MR element 110B is deselected, voltage source 201B is set to a voltage low enough to turn off transistors 107B and 108B, and voltage source 201A is providing a bias voltage to transistors 107A and 108A, which form a common base differential input stage. Current through each half of the differential pair input stage is controlled separately so as to maintain equal current through the two halves regardless of variations in component characteristics or the steady state resistance of the MR element. Current source 203 provides a constant current through transistor 107A equal to the constant current provided by current source 204 through transistor 108A.

The current from current source 204 through transistor 108A also flows through MR element 110A. Thus, MR element 110A is provided with sufficient bias current to allow MR sensing to occur.

For AC signals, capacitor 202 presents low impedance and couples the two halves of the differential pair input stage to allow the input stage to function as a differential amplifier. However, the DC steady state currents through the halves of the differential pair are blocked by capacitor 202. Since current sources 203 and 204 provide equal current and the current is blocked from going to the opposite side of the differential pair by capacitor 202, equal current is maintained in the two halves of the differential pair input stage.

When multiple input stages are present, significant capacitance is often present in the lines which coupled them to the remainder of the circuit. When these capacitances are combined with the resistances present in the lines and components, they can have a filtering effect, limiting the bandwidth. To avoid reduction of bandwidth, an additional common base stage may be added to the circuit to form with the input stages a cascode configuration. The additional common base stage of FIG. 3 includes transistors 301 and 302 and voltage source 303.

Generally, a cascode configuration involves interposing a transistor between the collector of an amplifier transistor and its collector resistor to eliminate the Miller effect and other capacitive effects by preventing the amplifier transistor's collector from swinging while passing the collector current through the resistor unchanged. The interposed transistor is biased with a fixed voltage, typically set a few volts above the emitter voltage of the amplifier transistor in order to keep a sufficient voltage on the collector of the amplifier transistor so as to keep it in the active region.

In FIG. 3, transistor 301 is interposed between the collector of transistor 107A and resistor 102, and transistor 302 is interposed between the collector of transistor 108A and resistor 103. Transistors 301 and 302 are biased by voltage source 303, which provides a fixed bias voltage. Thus, transistors 301 and 302, along with voltage source 303, form a cascode configuration with the half of the differential pair input stage that includes transistor 107A, thereby eliminating the adverse effects of the increased capacitance associated with multiple MR elements.

In the steady state, current flows through resistor 102, transistors 301 and 107A, and current source 203. Current also flows through resistor 103, transistors 302 and 108A, and current source 204. Capacitor 202 blocks DC flow between the two halves of the differential pair. Current sources 203 and 204 provide equal amounts of current through the two halves of the differential pair. Thus, the steady state balance of the differential pair is maintained.

When a magnetic field is incident upon MR element 110A, the resistance of MR element 110A varies from its steady state value. The variation of resistance of the MR element results in a variation of current through the MR element. This variation of current is amplified by differential pair 107A and 108A and results is variation of the current flow through resistors 102 and 103. Since one side of each of resistors 102 and 103 is coupled to voltage source 101, the variation of current through resistors 102 and 103 causes a variation in voltages at outputs 104 and 105. Thus, outputs 104 and 105 provide a signal representative of the magnetic field which is incident upon MR element 110A.

Although the above explanation assumed that MR element 110A was selected and MR element 110B was deselected, that is not the only mode in which the circuit of FIG. 3 can operate. Another mode of operation allows MR element 110B to be selected and MR element 110A to be deselected. To select MR element 110B, voltage source 201A must be set to a voltage which turns off transistors 107A and 108A, and voltage source 201B must be set to a voltage which allows current to flow through transistors 107B and 108B. Deselection and selection may be performed simultaneously or sequentially, with deselection preceding selection. With MR element 110B selected, transistor 107B functions identically to the way transistor 107A functions when MR element 110A is selected and transistor 108B functions identically to transistor 108A. Thus, the above description of the operation of transistors 107A and 108A, MR element 110A, and voltage source 201A also applies to MR element 110B if transistors 107B and 108B and voltage source 201B are substituted for transistors 107A and 108A and voltage source 201A, respectively.

There is also another mode of operation for the circuit of FIG. 3. If both voltage sources 201A and 201B are set to voltages insufficient to bias their respective transistors, the circuit may be placed in a quiescent state to minimize power consumption when no input is desired from the MR elements.

Figure 4:
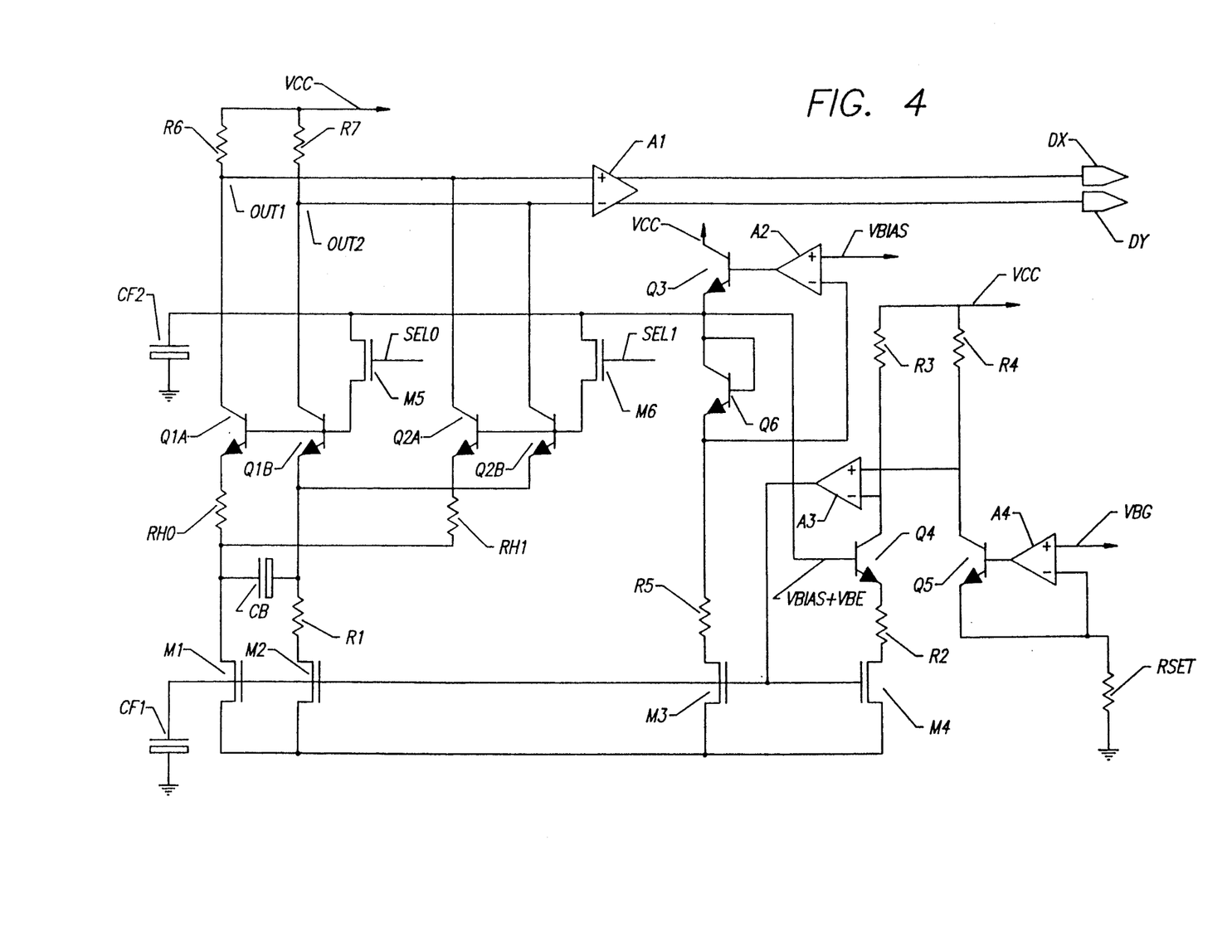
FIG. 4 is a detailed schematic diagram illustrating a MR head amplifier circuit including head select control circuitry based on the present invention for amplifying signals from two MR heads.

A second alternate embodiment of the present invention is illustrated in FIG. 4. In the alternate embodiment of FIG. 4, voltage source VCC is coupled to the first terminals of resistors R6 and R7. The second terminal of resistor R6 is coupled to the collectors of transistors Q1A and Q2A and to the non-inverting input of amplifier A1 at node OUT1. The second terminal of resistor R7 is coupled to the collectors of transistors Q1B and Q2B and to the inverting input of amplifier A1 at node OUT2. Amplifier A1 produces outputs DX and DY.

The emitter of transistor Q1A is coupled to the first terminal of MR element RH0. The emitter of transistor Q2A is coupled to first terminal of MR element RH1. The second terminals of MR elements RH0 and RH1 are coupled to each other and to the first terminal of capacitor CB and the drain of field effect transistor (FET) M1. The emitters of transistors Q1B and Q2B are coupled to each other and to the second terminal of capacitor CB and the first terminal of resistor R1. The second terminal of resistor R1 is coupled to the drain of FET M2.

Voltage source VBIAS is coupled to the non-inverting input of amplifier A2. The output of amplifier A2 is coupled to the base of transistor Q3. The collector of transistor Q3 is coupled to Voltage source VCC. The emitter of transistor Q3 is coupled to the collector and base of transistor Q6, the base of transistor Q4, the drains of FET's M5 and M6, and to the first terminal of capacitor CF2. The second terminal of capacitor CF2 is coupled to voltage source GND. The source of FET M5 is coupled to the bases of transistors Q1A and Q1B. The source of FET M6 is coupled to the bases of transistors Q2A and Q2B. The gate of FET M5 is coupled to input signal SEL0. The gate of FET M6 is coupled to input signal SEL1. The emitter of transistor Q6 is coupled to the inverting input of amplifier A2 and to the first terminal of resistor R5. The second terminal of resistor R5 is coupled to the drain of FET M3.

Bandgap voltage VBG is coupled to the non-inverting input of amplifier A4. The output of amplifier A4 is coupled to the base of transistor Q5. The emitter of transistor Q5 is coupled to the inverting input of amplifier A4 and to the first terminal of resistor RSET. The second terminal of resistor RSET is coupled to voltage source GND.

Voltage source VCC is coupled to the first terminals of resistors R3 and R4. The second terminal of resistor R3 is coupled to the inverting input of amplifier A3 and to the collector of transistor Q4. The second terminal of resistor R4 is coupled to the inverting input of amplifier A3 and to the collector of transistor Q5. The emitter of transistor Q4 is coupled to the first terminal of resistor R2. The second terminal of resistor R2 is coupled to the drain of FET M4. The output of amplifier A3 is coupled to the gates of FET's M1, M2, M3, and M4, and to the first terminal of capacitor CF1. The second terminal of capacitor CF1 is coupled to voltage source GND. The sources of FET's M1, M2, M3, and M4 are coupled to voltage source GND.

The circuit of FIG. 4 allows the use of multiple MR elements. Although the circuit of FIG. 4 is shown with two MR elements, it is understood that the present invention may be practiced with fewer or more MR elements that those shown in FIG. 4.

In FIG. 4, MR element RH0 is coupled to the common base differential pair input stage that includes transistors Q1A and Q1B. MR element RH1 is coupled to the common base differential pair input stage that includes transistors Q2A and Q2B. FET switch M5 may be used to couple or decouple the bases of transistors Q1A and Q1B to the bias voltage present at node VBIAS+VBE. Thus, FET switch M5 may be used to select or deselect MR element RH0 by activating or deactivating input SEL0. Likewise, FET switch M6 may be used to couple or decouple the bases of transistors Q2A and Q2B to the bias voltage present at node VBIAS+VBE. Thus, FET switch M6 may be used to select or deselect MR element RH0 by activating or deactivating input SEL1. By deactivating both inputs SEL0 and SEL1, the circuit can be placed in a quiescent state to minimize power consumption when inputs from the MR elements are not required.

The input stage associated with MR element RH0 includes transistors Q1A and Q1B and FET switch M5 with input SEL0. The input stage associated with MR element RH1 includes transistors Q2A and Q2B and FET switch M6 with input SEL1. Regardless of which MR element is selected, the input stage associated with the selected MR element is biased by two current sources, M1 and M2, which provide constant current. The current provided by M1 serves as sense current for the selected MR element. Also, the two halves of whichever input stage is selected are AC coupled by capacitor CB.

The bias voltage applied to input stage transistors Q1A and Q1B or Q2A and Q2B is supplied by the part of the circuit which includes amplifier A2, transistors Q3 and Q6, resistor R5, and current source M3. Amplifier A2 receives at its non-inverting input the voltage input VBIAS. The voltage of VBIAS in this embodiment may be 0.5 volts, although other levels may also be used. Transistor Q6 has its collector coupled to its base so as to provide a voltage drop, VBE, characteristic of its semiconductor material, geometry and collector current, between its base and its emitter. Depending upon the materials used, VBE might be approximately 0.8 V or it might be higher or lower. Transistor Q3 is configured as an emitter follower on the output of amplifier A2. Resistor R5 and current source M3 provide a current path to voltage source GND.

Since transistor Q6 introduces a voltage drop of VBE in the negative feedback loop of amplifier A2, the output of amplifier A2 is offset by VBE from the noninverting voltage input VBIAS. Thus, the voltage at node VBIAS+VBE is equal to the sum of VBIAS and VBE. The voltage at VBIAS+VBE is filtered by capacitor CF2 and selectably applied through FET switch SEL0 to the bases of transistors Q1A and Q1B and through FET switch SEL1 to the bases of transistors Q2A and Q2B. Node VBIAS+VBE also supplies voltage to the base of transistor Q4, which is also configured as an emitter follower.

Since the voltage at VBIAS+VBE is coupled to the bases of transistors Q1A, Q1B, Q2A, Q2B, Q6, and Q4, and a characteristic voltage drop of VBE exists between the base and emitter of these transistors, the emitters of these transistors are all at a voltage level of VBIAS. This arrangement maintains equality over the drain to source voltages of current sources M1, M2, M3, and M4.

Current control for the this embodiment is provided by amplifiers A3 and A4, transistors Q4 and Q5, FET's M1, M2, M3, and M4, resistors RSET, R2, R3, and R4, and capacitor CF1. It is understood that many current control techniques are known in the prior art and that the present invention is not limited to the particular current control arrangement illustrated in FIG. 4, but may be practiced with other current control techniques as well.

Reference voltage VBG, which is a bandgap voltage characteristic of the particular semiconductor material used, is applied to the non-inverting input of amplifier A4. The voltage of voltage reference VBG may be 1.26 V or it may be higher or lower depending upon the material used. Amplifier A4 produces an output which is coupled to transistor Q5, which is configured as an emitter follower. Since the emitter of transistor Q5 is coupled to the inverting input of amplifier A4, a negative feedback loop is provided. Alternatively, Q5 can be replaced with a FET configured as a source follower. Thus, amplifier A4 adjusts its output to provide a voltage at the inverting reference equal to voltage reference VBG at the non-inverting input. Reference voltages other than bandgap (1.26 V) can be used for VBG input.

Since the voltage at the inverting input of amplifier A4 is fixed at the level of voltage reference VBG, the resistance of resistor RSET can be selected to determine the amount of current, referred to as IREF, flowing through resistor RSET, which also determines the current flow IR4 through resistor R4.

Amplifier A3 compares the voltage across R3 with the voltage across R4, which is equal to R4 times IR4. By selecting appropriate ratios of R3 to R4, the amount of current through resistor R3 can be set. In this embodiment, the ratio of R4 to R3 is set to four to one, providing an ratio of the current through resistor R3, referred to as IR3, to the current through resistor R4, referred to as IR4, of four to one. The present invention may also be practiced with other ratios. The current through R3 also flows through transistor Q4, resistor R2, and current source M4, which is implemented with a FET. The output of amplifier A3 is filtered by capacitor CF1 and coupled to the gate of FET current source M4, thus providing a closed loop for the control of current.

The circuit of the FIG. 4 also allows the drain voltages of FET current sources M1-M4 to be set equal. The drain voltages are equal to VBIAS minus the voltage drop across the resistors located between the transistor emitters and the FET current source drains. Thus, the drain voltage of FET current source M1 is equal to VBIAS minus the voltage drop across the selected MR element (both MR elements are chosen to have equal resistance). Likewise, the drain voltage of FET current source M2 is equal to VBIAS minus the voltage drop across resistor R1 (resistor R1 is chosen to have the same resistance as MR elements RH0 and RH1).

The values of the resistors can be chosen to set the desired currents through current sources M1, M2, M3, and M4. The value of resistor RSET is selected to determine the current IR4 through resistor R4. The value of resistor R3 is selected to be one fourth that of resistor R4 so that IR3 will be equal to four times IR4. The ratio of resistors R3 and R4 also sets the current through current source M4. The currents through M1, M2 and M3 are set with respect to the current through M4 by choosing appropriate geometries for FET's M1, M2 and M3 relative to the geometry of the M4. The ratio of the current thus selected is $I_{M1}:I_{M2}:I_{M3}:I_{M4}=32:32:1:4$. However, the present invention may be practiced with other resistor or current ratios or other geometries.

Since the resistance of the MR element is assumed to be fixed because of the limitations imposed on the structure and design of the MR element by the requirements of the intended application of the MR element, all other resistors may be selected based on the resistance of the MR element. In multiple MR element designs, the resistance of all MR elements can be chosen to be equal or nearly equal. Since only the current through current source M4, referred to as IM4, is controlled by the feedback loop of amplifier A3, it is important to set the values of the resistors so as to maintain equal drain voltages for current sources M1, M2, M3, and M4 so that they will track current source M4 and provide the desired current regulation. To maintain consistent performance of current source M1, MR elements RH0 and RH1 are chosen to have equal or nearly equal resistance. To make the drain voltage of current source M2 equal to the drain voltage of current source M1, the value of resistor R1 is selected to be equal to that of MR elements RH0 and RH1. To make the drain voltage of current source M3 equal, the value of resistor R5 is selected to be equal to 32 times the steady state resistance of MR elements RH0 and RH1. To make the drain voltage of current source M4 equal, the value of resistor R2 is selected to equal to 8 times the steady state resistance of MR elements RH0 and RH1. With resistors having these values, the drain voltages of current sources M1, M2, M3, and M4 are kept equal. Although the present invention may be practiced with a wide range of resistance values, the following are typical resistance values: RH0=12Ω, RH1=12Ω, R1=12Ω, R5=384Ω, R2=96Ω, R3=500Ω, R4=2KΩ.

Since only current source M4 is regulated in a closed loop mode by amplifier A3 and current sources M1, M2, and M3 are all operating in an open loop mode, the characteristics of current sources M1, M2, M3, and M4 must be closely matched to assure proper regulation of current through all four current sources. Each symbolic transistor of FIG. 4 may be implemented as one or more actual transistors. By using multiple actual transistors, the number of transistors actually used may be in proportion to the current capacity requirements for that device. Thus, the current capacity requirements may be met while maintaining the smallest transistor layout possible. Use of multiple actual transistors for each symbolic transistor of FIG. 4 increases the degree of matching of component characteristics. Variation of the characteristics of the transistor as a whole is not as great as any variation that might occur in a particular actual transistor of the integrated circuit. To assure the best possible matching of characteristics, the individual actual transistors of the four current sources M1–M4 of FIG. 4 are interdigitated. Interdigitation involves distributing the individual actual transistors of the current sources such that the transistors of one current source are not all located adjacent to one another on the integrated circuit, but are intermingled with those of the other current sources so that the average location of actual transistors of each current source is approximately the same. Any other techniques known in the art to improve matching of characteristics may be used to assure proper matching.

One advantage of the circuit of FIG. 4 is that transistors Q1A, Q1B, Q2A, and Q2B and FET switches M5 and M6 are configured to allow amplification and selection of multiple MR elements at low supply voltages. Since the input stages of FIG. 4 have only one transistor in any path from voltage source VCC to voltage source GND, only one voltage drop of VBE is present in any input stage current path. Thus, the higher voltage supply requirements for circuits with multiple series VBE voltage drops are eliminated. As illustrated in FIG. 3, however, the present invention is not limited to circuits with only one transistor in each current path of the input stage.

Regardless of which MR element is selected, the output from the input stage associated with the selected MR element appears across the terminals of collector resistors R6 and R7 at nodes OUT1 and OUT2. The signals from nodes OUT1 and OUT2 are amplified by amplifier A1 to produce outputs DX and DY.

Thus, a simpler and more efficient circuit for selecting and biasing MR elements and amplifying the signals therefrom over a broad frequency range while minimizing switching transients has been provided.

I claim:

1. A circuit for biasing a magnetoresistive element and amplifying signals produced by said magnetoresistive element, said circuit comprising:
   a first current source coupled to said magnetoresistive element and to a power supply;
   an input stage, comprising a plurality of transistors coupled in a first differential pair configuration wherein an emitter of a first transistor of said first differential pair of transistors is coupled to said magnetoresistive element, for amplifying current deviations resulting from variation of resistance of said magnetoresistive element; and
   a voltage source coupled to the bases of said first differential pair of transistors for providing a bias voltage;
   a second current source coupled to an emitter of a second transistor of said differential pair of transistors.

2. The circuit of claim 1 further comprising:
   a capacitor coupled to said differential pair of transistors and to said first and second current sources.

3. The circuit of claim 1 further comprising:
   selection means coupled to said voltage source for selecting a first one of a plurality of magnetoresistive elements and deactivating a remainder of said plurality of magnetoresistive elements.

4. The circuit of claim 3 wherein said selection means comprises a switching element for selectably coupling said voltage source to said input stage.

5. Apparatus for biasing a magnetoresistive sensor and amplifying signals produced by a magnetoresistive sensor when exposed to a changing magnetic field, said sensor having a steady-state resistance value, said apparatus comprising:
   current receiving means for receiving current from said magnetoresistive sensor, and for producing, in response thereto, signals representing a change in sensor resistance arising from changes in a magnetic field to which the sensor is exposed;
   amplifying means coupled to said current receiving means for amplifying said signals produced thereby, and having an output for transmitting said amplified signals therefrom, said amplifying means having a differential configuration with a first side of said differential configuration coupled to a second side of said differential configuration, wherein said magnetoresistive sensor is coupled between said amplifying means and a capacitor;
   biasing means for providing a bias signal to said amplifying means independent of said output.

6. The apparatus of claim 5 further comprising:
   selecting means coupled to said current receiving means for selecting one of a plurality of magnetoresistive sensors.

7. The apparatus of claim 6 further comprising:
   bandwidth increasing means for increasing a bandwidth of said amplifying means.

8. A circuit for biasing a magnetoresistive element and amplifying signals produced by said magnetoresistive element, said circuit comprising:
   first amplifying means coupled to said magnetoresistive element;
   second amplifying means coupled to said first amplifying means in a differential amplifier configuration;
   a first current source for providing a first current through said first amplifying means;
   a second current source for providing a second current through said second amplifying means; and
   coupling means comprising a capacitor for coupling said signals to said second amplifying means.

9. The circuit of claim 8 wherein said first amplifying means comprises a first transistor and said second amplifying means comprises a second transistor.

10. The circuit of claim 9 wherein a third transistor is coupled to said first transistor in a cascode configuration and a fourth transistor is coupled to said second transistor in a cascode configuration.

11. The circuit of claim 8 further comprising:
   third amplifying means for amplifying second signals produced by a second magnetoresistive element; and
   fourth amplifying means coupled to said third amplifying means in a second differential amplifier configuration.

12. The circuit of claim 8 wherein said first amplifying means comprises a first plurality of transistors coupled to each other and said second amplifying means comprises a second plurality of transistors coupled to each other.

13. The circuit of claim 8 wherein said first current and said second current are of an equal magnitude.

14. A circuit for biasing a magnetoresistive element and amplifying signals produced by said magnetoresistive element, said circuit comprising:
   a first current source coupled to said magnetoresistive element and to a power supply;

an input stage, comprising a plurality of transistors coupled in a first differential pair configuration wherein an emitter of a first transistor of said first differential pair of transistors is coupled to said magnetoresistive element, for amplifying current deviations resulting from variation of resistance of said magnetoresistive element; and a voltage source coupled to the bases of said first differential pair of transistors for providing a bias voltage;

output means coupled to collectors of said first differential pair of transistors for transmitting output signals;

a second current source coupled to an emitter of a second transistor of said differential pair of transistors.

15. The circuit of claim 14 further comprising:

a capacitor coupled to said differential pair of transistors and to said first and second current sources.

* * * * *